US005629053A

United States Patent [19]
Treichel et al.

[11] Patent Number: 5,629,053
[45] Date of Patent: May 13, 1997

[54] METHOD FOR MANUFACTURING MICROCRYSTALLINE CUBIC BORON-NITRIDE-LAYERS

[75] Inventors: Helmuth Treichel, Augsburg; Oswald Spindler, Vaterstetten; Rainer Braun, Munich, all of Germany; Bernhard Neureither, Fishkill, N.Y.; Thomas Kruck, Erfstadt, Germany

[73] Assignee: Siemens Aktiengesellschaft, Munich, Germany

[21] Appl. No.: 681,131

[22] Filed: Apr. 5, 1991

[51] Int. Cl.$^6$ ............................................. C23C 16/34
[52] U.S. Cl. ........................................ 427/571; 427/255.1
[58] Field of Search .......................... 427/38, 39, 255.1

[56] References Cited

U.S. PATENT DOCUMENTS

| | | | |
|---|---|---|---|
| 4,440,108 | 4/1984 | Little et al. | 118/719 |
| 4,655,893 | 4/1987 | Beale | 427/569 |
| 4,762,729 | 8/1988 | Hirano et al. | 427/38 |
| 4,941,430 | 7/1990 | Watanabe et al. | 427/571 |
| 4,971,779 | 11/1990 | Paine, Jr. et al. | 423/290 |
| 5,082,693 | 1/1992 | Paine, Jr. et al. | 427/226 |
| 5,096,740 | 3/1992 | Nakagama et al. | 427/587 |

FOREIGN PATENT DOCUMENTS

| | | |
|---|---|---|
| 0216932 | 4/1987 | European Pat. Off. . |
| 61-153279 | 7/1986 | Japan . |
| 61-149478 | 11/1986 | Japan . |
| 62-047472 | 3/1987 | Japan . |
| 63-069973 | 3/1988 | Japan . |
| 63-239197 | 10/1988 | Japan . |
| 2025562 | 1/1990 | Japan . |

OTHER PUBLICATIONS

Plasma Deposited Thin Films, J. Mort and F. Jansen CRC Press p. 3 1986 (no month).
Chayahara et al, Properties of BN Thin Films Deposited by Plasma CVD, Applied Surface Science, 33/34 1988, pp. 561–566 (no month).
Halverson et al., Effects of Charge Neutralization on Ion–Beam–Deposited Boron Nitride Films, Journal of Vacuum Science and Technology A, vol. 3, No. 6, Nov.–Dec. 1985 pp. 2141–2146.
Johnson et al, Radiation Damage Effects in Boron Nitride Mask Membranes Subjected to X-Ray Exposures, Journal of Vacuum Science and Technology B, vol. 5, No. 1, Jan.–Feb. 1987, pp. 257–261.
Patent Abstracts of Japan, vol. 10, No. 355, Nov. 1986 JA 61–153279.
Patent Abstracts of Japan, vol. 13, No. 339 (C–624) [3687], May, 1989 JA 01–116078.
Patent Abstracts of Japan, vol. 10, No. 350, Nov. 1986 JA 61–149478.
Rand et al., Preparation and Properties of Thin Film Boron Nitride, Journal of the Electrochemical Society Solid State Science, vol. 115, No. 4, Apr. 1968, pp. 423–429.
Schmolla et al, Amorphous BN Films Produced In a Double–Plasma Reactor for Semiconductor Applications, Solid–State Electronics, vol. 26, No. 10, 1983, pp. 931–939 (no month).
Schmolla et al, Low Temperature Double–Plasma Process for BN Films on Semiconductors, Journal of the Electrochemical Society, vol. 129, No. 11, 1982, pp. 2636–2637 (no month).

*Primary Examiner*—Shrive Beck
*Assistant Examiner*—Timothy Meeks
*Attorney, Agent, or Firm*—Hill, Steadman & Simpson

[57] ABSTRACT

The method of the present invention provides in a simple manner, the deposition of boron nitride layers with microcrystalline cubic structure which are suitable as insulating layers in VLSI-circuits, as mask membranes in x-ray lithography, as well as coating hard substances. Due to the use of excited starting substances that already contain boron and nitrogen in one molecule and are preferably liquid or solid, and the use of a plasma-CVD-method, the method can be performed using in temperatures of below 500° C. The excitation of the starting substance proceeds preferably in inductive or capacitative fashion in a hollow cathode.

11 Claims, 1 Drawing Sheet

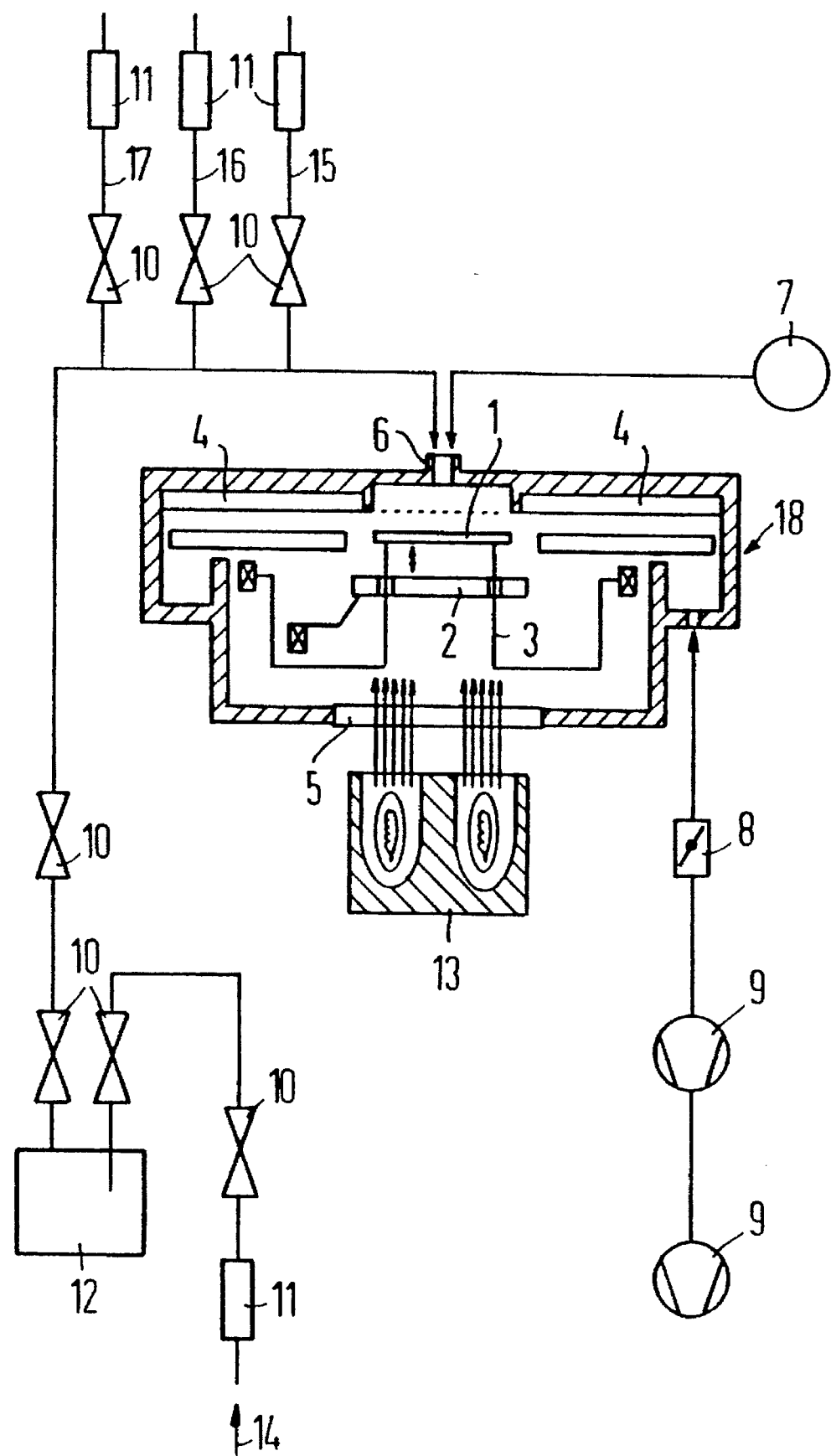

METHOD FOR MANUFACTURING MICROCRYSTALLINE CUBIC BORON-NITRIDE-LAYERS

BACKGROUND OF THE INVENTION

The present invention relates to methods for manufacturing microcrystalline cubic boron-nitride-layers through chemical vapor deposition in an electromagnetic alternating field (PECVD-method).

For a number of technical applications, boron-nitride layers are of great interest. For example, boron-nitride layers have applications as insulating layers in integrated circuits. For intermetal insulating and final passivation layers for use in VLSI semiconductor circuits, dielectric layers having small dielectric constants $\epsilon_r$, good insulating and blocking properties, and high breakthrough stability, are necessary. Additionally, it is necessary that the layers have an optimally conformal edge covering and are not hygroscopic. Boron-nitride layers are suitable for these requirements, particularly because they have a sufficiently low dielectric constant in either an amorphous or polycrystalline form.

The article of W. Schmolla and H. Hartnagel, in Solid State Electronics 26, No. 10, page 931 to 939, discloses that for the manufacture of crystalline boron-nitride layers, relatively high temperatures are necessary. Additionally, the article discloses that because of the increased energy gap, improved insulating properties are to be expected with cubic crystalline boron nitride as compared with other crystalline forms.

Known methods for the production of cubic boron nitride are based on a multistage process. First, boron nitride in a different crystalline form, principally in a hexagonal or rhombohedral phase, is generated. This is then converted into a cubic phase using a high temperature and high pressure (see, e.g., EPA 0 216 932).

Even for the production of the rhombohedral or hexagonal phase, typically, temperatures above 750° C. are necessary. Because of such temperatures, these processes are not viable for the production of intermetal insulating and final passivation layers for VLSI semiconductor circuits.

The article of A. Chayahara et al. in Appl. Surface Science 33/34 (1988) p. 561–566, suggests a method for manufacturing cubic boron nitride using $B_2H_6$ and nitrogen in a PECVD-method. This method is not suitable for manufacturing applications since it has a deposition rate of less than 6 nm/min. To this end, typical layer thicknesses of a few 100 nm are required for use as an insulation layer. Another disadvantage of the method is that it uses a very dangerous gaseous starting substance $B_2H_6$.

Another application of boron-nitride layers is for mask membranes in x-ray lithography. For manufacturing of so-called VLSI-components with structure sizes below 0.5 μm, the application of x-ray lithography is necessary. An x-ray mask requires the use of a thin membrane, that is highly permeable to soft x-rays. Additionally, the membrane must be dimensionally stable during the manufacturing process and during its use for the component manufacturing. As revealed in the article W. Johnson et al. in Journal of Vacuum Science and Technology B5, January 1987, p. 257 to 261, amorphous boron nitride is basically well suited for use as a mask membrane. It can be produced, for example, using the method described in the article of Schmolla and Hartnagel set forth above.

There are some disadvantages, however, in the use of boron nitride as a mask membrane. In air, the resultant boron nitride layers change their surface and structure—due, for example, to boric acid crystal growth. The reduced transmission of the layers connected therewith makes the optical adjustment of the mask difficult when it is used for component manufacturing. Local changes of mechanical tensions in the boron nitride layer can cause a displacement of the mask. This results in adjustment inaccuracies that are not tolerable.

Another disadvantage is the complicated system structure that is required. Further, the starting substances used for the manufacturing method are dangerous.

A still further, application of boron-nitride layers is for coating hard material. Cubic boron nitride is principally used for the production of grinding discs and turning tools, as well as for the processing of hardened steel, tool steel, super alloys, and chrome nickel steel.

The hardness of cubic boron nitride layers is preserved up to approximately 600° C. In contrast, the hardness of, for example, tungsten carbide considerably decreases at approximately 300° to 400° C. (see, e.g., M. Rand, J. Roberts in Journal Electrochem. Soc. 115, 1968, page 423). Such layers are principally generated from the hexagonal phase of the boron nitride at temperatures of above 1500° C. and a pressure of above 80 kbar. The disadvantages of this method include the necessity of at least two unit processes and the high temperatures that are necessary, which change the structure of the workpiece to be hardened.

SUMMARY OF THE INVENTION

The present invention provides a method that enables the manufacture of cubic crystalline boron nitride layers under distinctly lower temperatures particularly below 500° C., in a simple manner. The process is performed in a single stage and does not require dangerous starting substances nor a complicated system. The cubic boron nitride layers generated can be created so that they have properties required for the desired application. Particularly, a dielectric constant $\epsilon_r < 4$ for the use as an intermetal dielectricum, a high permeability to soft x-radiation for the use in x-ray lithography, and a high Vickers-hardness for use in the coating of hard materials.

To this end, a method for manufacturing a microcrystalline cubic boron nitride layer is provided. The layer is produced via chemical vapor deposition in an electromagnetic alternating field given a temperature in the range from 200° to 450° C. using an excited starting substance which contains boron and nitrogen in one molecule.

In an embodiment, a compound with a coordinative boron-nitrogen combination is used as the starting substance.

In an embodiment, a compound with a covalent boron-nitrogen combination is used as the starting substance.

In an embodiment, a compound having a ratio of boron to nitrogen of <1 is used as the starting substance.

In an embodiment, the starting substance contains at least one group chosen from the group consisting of alkyl-, aryl-, $NH_2$- and/or hydrogen or halogen.

In an embodiment, $B_3N_3H_6$ (borazol) is used as the starting substance.

In an embodiment, the starting substance includes a mixture of compounds containing boron and nitrogen.

In an embodiment, ammonia or nitrogen is added during the method.

In an embodiment, the method includes an inductive or capacitative excitation of at least the starting substance in a hollow cathode.

In an embodiment, the following process parameters are used:

| Deposition temperature | 200–450° C. |
|---|---|
| Process pressure | 1–100 mbar |
| RF-power | 100–800 W |
| Electrode distance | 0.3–1.5 cm |
| Carrier gas flow | 0–600 sccm $N_2$ or He |
| $N_2$- or $NH_3$-flow | 0–500 sccm |
| Evacuator temperature | 25–120° C. |

The mechnical, electrical or chemical properties of the deposited boron nitride layer can be adjusted by the selection of the starting substance and/or process parameter.

Additional features and advantages of the present invention are described in, and will be apparent from, the detailed description of the presently preferred embodiments and from the drawings.

BRIEF DESCRIPTION OF THE DRAWINGS

The FIGURE illustrates a perspective schematic view of a system for performing the method of the present invention.

DETAILED DESCRIPTION OF THE PRESENTLY PREFERRED EMBODIMENTS

The present invention provides a method for manufacturing microcrystalline cubic boron nitride layers.

Pursuant to the invention, starting substances are used that contain boron as well as nitrogen in one molecule. In an embodiment, the substances are excited, preferably with gaseous nitrogen or ammonia in a hollow cathode, and disintegrated in an electromagnetic alternating field with thermal support (PECVD-method). Thereby, the B:N-ratio of the layers to be deposited and their structure can be modified by a suitable selection of the starting substances, by modification of a residue R in the molecule of the starting substance, as well as by varying the parameters of the PECVD-process.

The FIGURE illustrates a system, diagrammatically, for chemical vapor deposition in an electromagnetic alternating field (PECVD). In an embodiment, this system is preferably used for the implementation of the method of the present invention.

Referring to the FIGURE, in a reactor chamber 18, a wafer 1 to be processed is located on a wafer lift 3 between the gas intake area 6 and the susceptor 2. The movement of the wafer lift 3 is indicated by a double arrow. Through the wafer lift 3, the electrode distance is adjusted.

To allow for the evacuation of the reactor chamber 18, two vacuum pumps 9 are provided that are connected via a butterfly valve 8. For the generation of an electromagnetic alternating field a RF-generator is used. Individual sections of the reactor chamber 18 are protected by insulators 4.

A bubbler 12 is provided for storing, prior to use, the preferred liquid starting substance. Helium or nitrogen can also be located in the bubbler as a carrier gas. For adjusting the nitrogen content, further gas feeder lines 15, 16, and 17 are provided for $N_2$ and $NH_3$. All gas feeder lines are provided with flow controllers 11 and pneumatic valves 10.

The deposition temperature in the reactor chamber 18, can be adjusted by lamps or a reflector module 13 that are provided. Irradiation of the system located in the reactor chamber 18 is performed through a quartz window. The excitation of the starting substance, and the $N_2$- or $NH_3$- gas if added, proceeds in the area of the gas admission 6. This excitation is achieved either in an inductive or capacitative manner, for example, in a hollow cathode.

The application of the boron nitride layer proceeds at a temperature of from approximately 200° to about 450° C. and at a pressure of approximately 1 to about 100 mbar in the illustrated PECVD-system. The starting substances can be applied either as a liquid or solid, and preferably using an evaporator temperature of from approximately 25° to about 120° C.

The starting substance enters the process chamber 18 of the system by means of a carrier gas, usually helium or nitrogen, or by suction. Excitation proceeds such that the starting substance does not disintegrate thereby. Particularly suitable herefor is a hollow cathode excitation in the gas admission region 6.

Additionally, nitrogen-containing process gases such as, for example, nitrogen or ammonia can be admitted to the process chamber and excited together with the starting substance. By the selection of a suitable boron or nitrogen containing starting substance, or a mixture of such starting substances, and the process parameters, boron nitride layers having the desired properties can be designationally generated. For example, the dielectric constant $\epsilon_r$ is controlled via the ratio of boron and nitrogen in the deposited layer; which again depends on the cited quantities.

By way of example, process parameters for the PECVD-process should be as follows:

| Deposition temperature | 200–450° C. |
|---|---|
| Process pressure | 1–100 mbar |
| RF-power | 100–800 W |
| Electrode distance | 0.3–1.5 cm |
| Carrier gas flow | 0–600 sccm $N_2$ or He |
| $N_2$- or $NH_3$- flow | 0–500 sccm |
| Evacuator temperature | 25–120° C. |

By way of example, and not limitation, examples of starting substances that can be used in the present invention are the following:

I. Compounds Having a Coordinative Boron-Nitrogen Combination

1. Adducts of borane to ammonia:
   $H_3B \leftarrow NH_3$.
2. Adducts of borane to amines:
   $H_3B \leftarrow NH_n R_{3-n}$ wherein R is Alkyl or Aryl;
   for example, $H_3B \leftarrow NH(CH_3)_2$.
3. Adducts of alkyl boranes to ammonia:
   $H_n R_{3-n} B \leftarrow NH_3$ wherein R is Alkyl or Aryl;
   for example, $H(CH_3)_2 B \leftarrow NH_3$.
4. Adducts of organylboranes to amines:
   $H_n R_{3-n} B \leftarrow NH_m R_{3-m}$ wherein R is Alkyl or Aryl;
   for example, $H(CH_3)_2 B \leftarrow NH(CH_3)_2$.
5. Adducts of halogen borane to amines or ammonia:
   $H_n X_{3-n} B \leftarrow NH_m R_{3-m}$ wherein:
   R is H, Alkyl, or Aryl;
   X is F, Cl, Br, or I;
   for example, $HCL_2 B \leftarrow NH(CH_3)_2$.
6. Adducts of alkylhalogenboranes to amines or ammonia:
   $X_n R_{3-n} B \leftarrow NH_m R_{3-m}$ wherein:
   R is H, Alkyl, or Aryl;
   X is F, Cl, Br, or I;
   for example, $Cl(CH_3)_2 B \leftarrow NH(CH_3)_2$.

7. Adducts of boron halogenides organylboron halogenides and hydrogen boron halogenides to pyridine derivatives:

$X_n R_{3-n} B \leftarrow NC_5H_{5-m}R'_m$ wherein:
R, R' is Alkyl or Aryl;
X is F, Cl, Br, or I;
for example, $Cl(CH_3)_2B \leftarrow NC_5H_6$.

8. Adducts of boron halogenides organylboron halogenides and hydrogen boron halogenides to nitriles:

$X_n R_{3-n} B \leftarrow NCR'$ wherein:
R, R' is H, Alkyl, or Aryl;
X is F, Cl, Br, or I;
for example, $Br(CH_3)_2B \leftarrow NC(C_2H_5)$.

II. Compounds Having a Covalent Boron-Nitrogen-Bond:

1. (Organyl-) amino-(organyl-) boranes:

$H_n R_{2-n} BNH_m R'_{2-m}$ wherein:
R, R' is Alkyl or Aryl;
for example, $HCH_3BNHC_2H_5$.

2. (Organyl-) amino-(organyl-) halogenboranes:

$H_n R_{2-n} BNH_m R'_{2-m}$ wherein:
R, R' is Alkyl or Aryl;
X is F, Cl, Br, or I;
for example, $HCH_3NBC_2H_5Cl$.

3. Borozines and borozine derivatives:

a) $B_3N_3R_6$ wherein R is H or $NH_2$; for example,

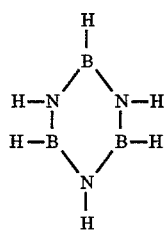

b) B-Halogenborazines: $B_3N_3H_3X_3$ wherein X is F, Cl, Br, or I; for example,

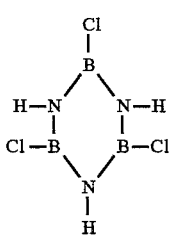

c) B-Triorganylborazines: $B_3N_3H_3R_3$ wherein R is Alkyl or Aryl; for example,

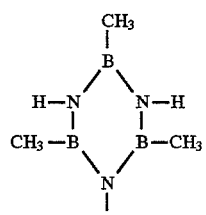

d) N-Triorganylborazines: $B_3N_3H_3R_3$ wherein R is Alkyl or Aryl; for example,

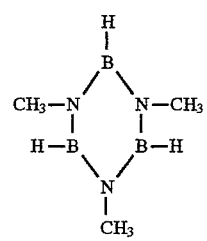

e) B,N-Hexaorganyl derivates: $B_3N_3R_6$ wherein R is Alkyl or Aryl; for example,

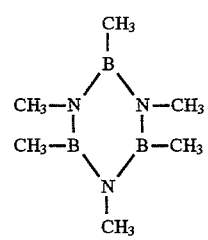

3. $B_2N_2R_6$ wherein R is H, F, Cl, Alkyl, Aryl, or $NH_2(B)$; for example,

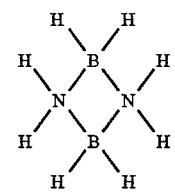

4. 1,2,3,4-Tetraorganyl-1,3-diaza-2,4-diboracyclobutane:

$B_2N_2R_4$ wherein R is H, F, Cl, Alkyl, Aryl, or $NH_2$ (B); for example,

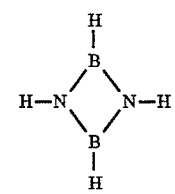

5. 1,2,3,4,5,6,7,8-Octaorganyl-1,3,5,7-tetraaza-2,3,6,8-tetraboracyclooctane:

$B_4N_4R_8$ wherein R is H, Alkyl, Aryl, or $NH_2$ (B); for example,

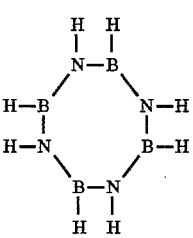

6. 1,3,5,7-Tetraorganyl-2,4,6,8-tetrahalogen-1,3,5,7-tetraaza-2,4,6,8-tetraboracyclooctane:

$B_4N_4R_4X_4$ wherein:
R is H, Alkyl, Aryl, or $NH_2$ (B)

X is F, Cl, Br, or I;

for example,

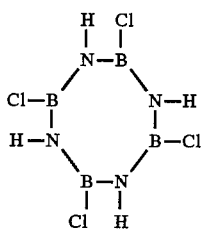

7. 2,3,4,6,7,8-Hexaorganyl-1,3,5,7-tetraaza-2,4,6,8-tetraborobi-cyclo (3,3,0)octane:

$B_4N_4R_6$ wherein R is H, Alkyl, Aryl, or $NH_2$ (B); for example,

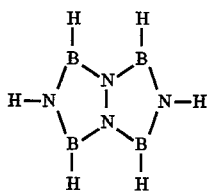

8. 1,2,-Diorganyl-1,2-azaborolanes:

$BNC_3H_6R_2$ wherein R is H, Alkyl, Aryl, or $NH_2$ (B); for example,

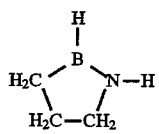

9. 1,2-Diorganyl-1,2,azaborinanes:

$BNC_4H_8R_2$ wherein R is H, Alkyl, Aryl, or $NH_2$ (B); for example,

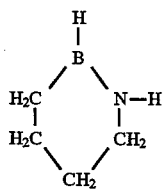

10. 1-Bora-5-azabicyclo(3,3,0)octane:

$BNC_6H_{12}$

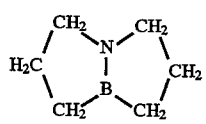

11. 1-Bora-6-azabicyclo(4,4,0)decane:
$BN(CH_2)_8$

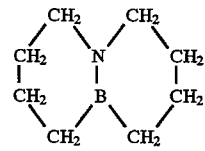

III. Compounds Having a Ratio of Boron:Nitrogen<1:

1. Diaminoboranes:

$RB(NR'_2)_2$ wherein R, R' is H, Alkyl, Aryl, or $NH_2$; for example, $CH_3B(N(C_2H_5)_2)_2$ 2. Triaminoboranes:

$B(NR_2)_3$ wherein R is H, Alkyl, Aryl, or $NH_2$; for example, $B(N(C_2H_5)_2)_3$ 3. B-Aminoborazines:

$B_3N_3(NR_2)_3R'_3$ wherein R, R' is H, Alkyl, Aryl, or $NH_2$ (B); for example,

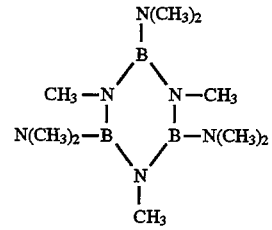

IV. Others:

1. $B_3N_3H_6R_6$ wherein R is H, Alkyl, Aryl, or $NH_2$; for example,

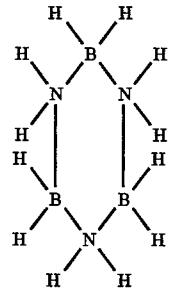

It should be understood that various changes and modifications to the presently preferred embodiments described herein will be apparent to those skilled in the art. Such changes and modifications can be made without departing from the spirit and scope of the present invention and without diminishing its attendant advantages. It is therefore intended that such changes and modifications be covered by the appended claims.

We claim:

1. A method for manufacturing microcrystalline cubic boron nitride layers, comprising the steps of:
providing a starting substance which contains a boron-nitrogen molecule; adding a process gas to the starting substance, the process gas being selected from the group consisting of ammonia and nitrogen; and exciting the starting substance and process gas in a hollow cathode such that the starting substance does not disintegrate; and disintegrating the starting substance and process gas by chemical vapor deposition in an electromagnetic alternating field at a temperature of from approximately 200° C. to about 450° C.

2. The method of claim 1 wherein a compound having a coordinative boron-nitrogen combination is used as the starting substance.

3. The method of claim 1 wherein a compound having a covalent boron-nitrogen combination is used as the starting substance.

4. The method of claim 1 wherein a compound having a ratio of boron:nitrogen <1 is used as the starting substance.

5. The method of claim 1 wherein the starting substance contains at least one compound selected from the group consisting of alkyl-group, aryl-group, $NH_2$- group, hydrogen and halogen.

6. The method of claim 1 wherein $B_3N_3H_6$(borazol) is used as the starting substance.

7. The method of claim 1 wherein the starting substance is a mixture of compounds which contains a boron-nitrogen molecule.

8. The method of claim 1 wherein the process parameters are as follows:

| | |
|---|---|
| Deposition temperature | 200–450° C. |
| Process pressure | 1–100 mbar |
| RF-power | 100–800 W |
| Electrode distance | 0.3–1.5 cm |
| Carrier gas flow | 0–600 sccm $N_2$ or He |
| $N_2$- or $NH_3$-flow | 0–500 sccm |
| Evacuator temperature | 25–120° C. |

9. The method of claim 1 including the step of adjusting the mechanical, electrical, and chemical properties of the deposited boron nitride layer by the selection of the starting substance.

10. The method of claim 1 including the step of adjusting the mechanical, electrical, and chemical properties of the deposited boron nitride layer by the selection of the process parameters.

11. A method for manufacturing microcrystalline cubic boron nitride layers comprising the steps of using a chemical vapor deposition in an electromagnetic alternating field using a temperature of from approximately 200° to about 450° C. and using a starting material selected from the group consisting of: adducts of borane to ammonia: adducts of borane to amines; adducts of alkyl boranes to ammonia adducts of organylboranes to amines; adducts of halogen borane to amines or ammonia; adducts of alkylhalogenboranes to amines or ammonia; adducts of boron halogenides organylboron halogenides and hydrogen boron halogenides to pyridine derivatives: adducts of boron halogenides organylboron halogenides and hydrogen boron halogenides to nitriles; (organyl-) amino-(organyl-) boranes; (organyl-) amino-(organyl-) halogenboranes; borozines; borozine derivatives; $B_3N_3R_6$ wherein R is selected from the group consisting of H and $NH_2$; B-halogenborazines; B-triorganylborazines; N-triorganylborazines; B,N-hexaorganyl derivates; $B_2N_2R_6$ wherein R is selected from the group consisting of H, F, Cl, Alkyl, Aryl, and $NH_2$; 1,2,3,4-tetraorganyl-1,3-diaza-2,4-diboracyclobutane; 1,2,3, 4,5,6,7,8-octaorganyl-1,3,5,7-tetraaza-2,3,6,8-tetraboracyclooctane; 1,3,5,7-tetraorganyl-2,4,6,8-tetrahalogen-1,3,5,7-tetraaza-2,4,6,8-tetraboracyclooctane; 2,3,4,6,7,8-hexaorganyl-1,3,5,7-tetraaza-2,4,6,8-tetraborobi-cyclo(3,3,0)octane; 1,2,-diorganyl-1,2-azaborolanes; 1,2-diorganyl-1,2,azaborinanes; 1-bora-5-azabicyclo (3,3,0) octane; 1-bora-6-azabicyclo(4,4,0)decane; diaminoboranes; triaminoboranes; B-aminoborazines; and $B_3N_3H_6R_6$ wherein R is selected from the group consisting of H, Alkyl, Aryl, and $NH_2$.

* * * * *